United States Patent
Nguyen

[11] Patent Number: 5,631,540
[45] Date of Patent: May 20, 1997

[54] METHOD AND APPARATUS FOR PREDICTING THE REMAINING CAPACITY AND RESERVE TIME OF A BATTERY ON DISCHARGE

[75] Inventor: Trung V. Nguyen, Lawrence, Kans.

[73] Assignee: Lucent Technologies Inc., Murray Hill, N.J.

[21] Appl. No.: 344,762

[22] Filed: Nov. 23, 1994

[51] Int. Cl.$^6$ .................................................. H01M 10/44
[52] U.S. Cl. .............................. 320/30; 320/35; 320/39
[58] Field of Search ................................ 320/5, 21, 30, 320/31, 35, 39, 48; 324/426, 427, 431

[56] References Cited

U.S. PATENT DOCUMENTS

| | | | |
|---|---|---|---|
| 4,275,351 | 6/1981 | Härer et al. | 324/427 |
| 4,377,787 | 3/1983 | Kikuoka | 324/431 |
| 4,952,862 | 8/1990 | Biagetti et al. | 320/48 |
| 5,151,865 | 9/1992 | Blessing et al. | 364/483 |
| 5,187,424 | 2/1993 | Benz et al. | 320/14 |
| 5,218,288 | 6/1993 | Mickal | 320/48 |
| 5,372,898 | 12/1994 | Atwater et al. | 320/48 X |
| 5,404,106 | 4/1995 | Matsuda | 324/431 |

*Primary Examiner*—Peter Wong
*Assistant Examiner*—Edward H. Tso
*Attorney, Agent, or Firm*—Alfred G. Steinmetz

[57] ABSTRACT

A highly accurate apparatus and method of predicting remaining capacity Q and reserve time t of a discharging battery to a selected end voltage is determined by an arrangement considering the open circuit voltage, battery voltage, battery temperature and its internal resistance. The remaining battery capacity Q is determined from the difference between the battery full charge open circuit voltage Eoc and the voltage loss due to the internal resistance of the battery IRint and the battery voltage on discharge divided by the battery temperature T, which is the temperature-corrected battery overvoltage.

15 Claims, 4 Drawing Sheets

METHOD AND APPARATUS FOR PREDICTING THE REMAINING CAPACITY AND RESERVE TIME OF A BATTERY ON DISCHARGE

FIELD OF THE INVENTION

This invention relates to an apparatus and method for measuring and predicting the remaining capacity and reserve time of a discharging battery. It is particularly concerned with predicting the capacity and reserve time of flooded or sealed lead acid batteries during discharge to an end-voltage.

BACKGROUND OF THE INVENTION

Predicting the remaining capacity and reserve time of a battery is important to the proper management of battery plants and of batteries remotely located. The fundamental method of prediction, of the prior art, is based on the Peukert equation:

$$t = aI^b \tag{1}$$

where t is the reserve time to a given end voltage, I is the discharge current and "a" and "b" are empirically determined parameters. The remaining reserve time during discharge is obtained by subtracting the actual time of discharge from the value "t" given by the equation. The only real time data used in this approach is the discharge current I, and the parameters "a" and "b" must be experimentally determined by extensive testing, data acquisition and parametric analysis. Once determined, these values are fixed and do not adapt to changing conditions and are not responsive to changing load requirements.

An attempt to be more responsive to changes in battery behavior during discharge is disclosed in the patent application Ser. No. 08/013272, filed Feb. 4, 1993, submitted by D. Levine et al which utilizes matrices of predetermined parameters that correlate the slope of the voltage-versus-discharge time at various discharge currents, battery voltages during discharge and end voltages. The use of voltage-versus-time slopes for prediction allows the method to be highly adaptable to changes in battery behavior during discharge. This method requires extensive testing to derive the data to populate the matrices.

Another approach, disclosed by R. Biagetti and A. Pesco in U.S. Pat. No. 4,952,862, operates by measuring the difference between battery voltage during discharges and the battery plateau voltage, $$V_{battery} - V_p \tag{2}$$

During discharge this difference is plotted against a ratio of discharged capacity to the total discharge capacity available:

$$Q_{removed}/Q_{to\text{-}end\text{-}voltage} \tag{3}$$

This plot, created from measured data, is a single curve having an exponential and a linear region. The curve is used to determine remaining capacity and reserve time from the measured discharged capacity $Q_{removed}$ and the plateau voltage $V_p$. As in the above described method, extensive prior testing and data analysis of the particular battery being monitored is required, and the method does not account for aging of the battery since of the plateau voltage is a predetermined fixed value.

Another approach to determining the reserve time of a discharging battery, disclosed in U.S. Pat. No. 4,876,513, takes advantage of the fact that when battery voltages (corrected for internal resistance) are plotted versus a ratio of ampere hours remaining to ampere hours available to a certain discharge voltage all discharge curves fall on a single curve. The battery voltages are calculated using a battery internal resistance that is measured periodically during discharge.

None of the existing methods for evaluating the state of a discharging battery works accurately at all temperatures, requires only a minimal number of parameters and is independent of the battery type being monitored.

SUMMARY OF THE INVENTION

A highly accurate apparatus and method of predicting remaining capacity Q and reserve time t of a discharging battery, to a selected end voltage is based on measurable battery parameters and does not require extensive pretesting of the battery. The battery reserve time t of a discharging battery is determined by an arrangement considering the discharge current (I), battery voltage (V battery), battery temperature (T) and the battery's internal resistance ($R_{int}$). The remaining battery capacity Q is determined from the ratio between a maximum theoretical capacity $Q_{max}$ and its present capacity Q. A term defined by a sum of the battery full charge open circuit voltage Eoc and the voltage loss due to the internal resistance of the battery $IR_{int}$ and the battery voltage on discharge divided by the battery temperature T, is computed as the temperature-corrected battery overvoltage $\eta$.

$$\eta = \frac{E_{oc} - IR_{int} - V_{battery}}{T} \tag{4}$$

The characteristics of the battery discharge are reduced to a ratio of the remaining battery capacity to maximum theoretical capacity:

$$\frac{Q}{Q_{max}} \tag{5}$$

This normalized battery capacity value is plotted versus the temperature-corrected battery overvoltage to produce a discharge characteristic curve that is invariant to discharge rates, temperatures, battery size, and aging effects and which is dependent only on the battery's internal design. This normalized battery capacity is determined by fitting parameters to the value $\eta$ by the relation $$\frac{Q}{Q_{max}} = \exp(a + b\eta^c + d\eta^e) \tag{6}$$

to characterize the discharge characteristic and determine Q.

A reserve time t is calculated from the determined value using the relation $$t = \frac{Q}{I} \tag{7}$$

The characteristic curve and the dynamic variables are stored in a computer and processed continuously to provide a continuing real time prediction of the remaining capacity and reserve time t of the battery on discharge.

DETAILED DESCRIPTION

Figure 1:
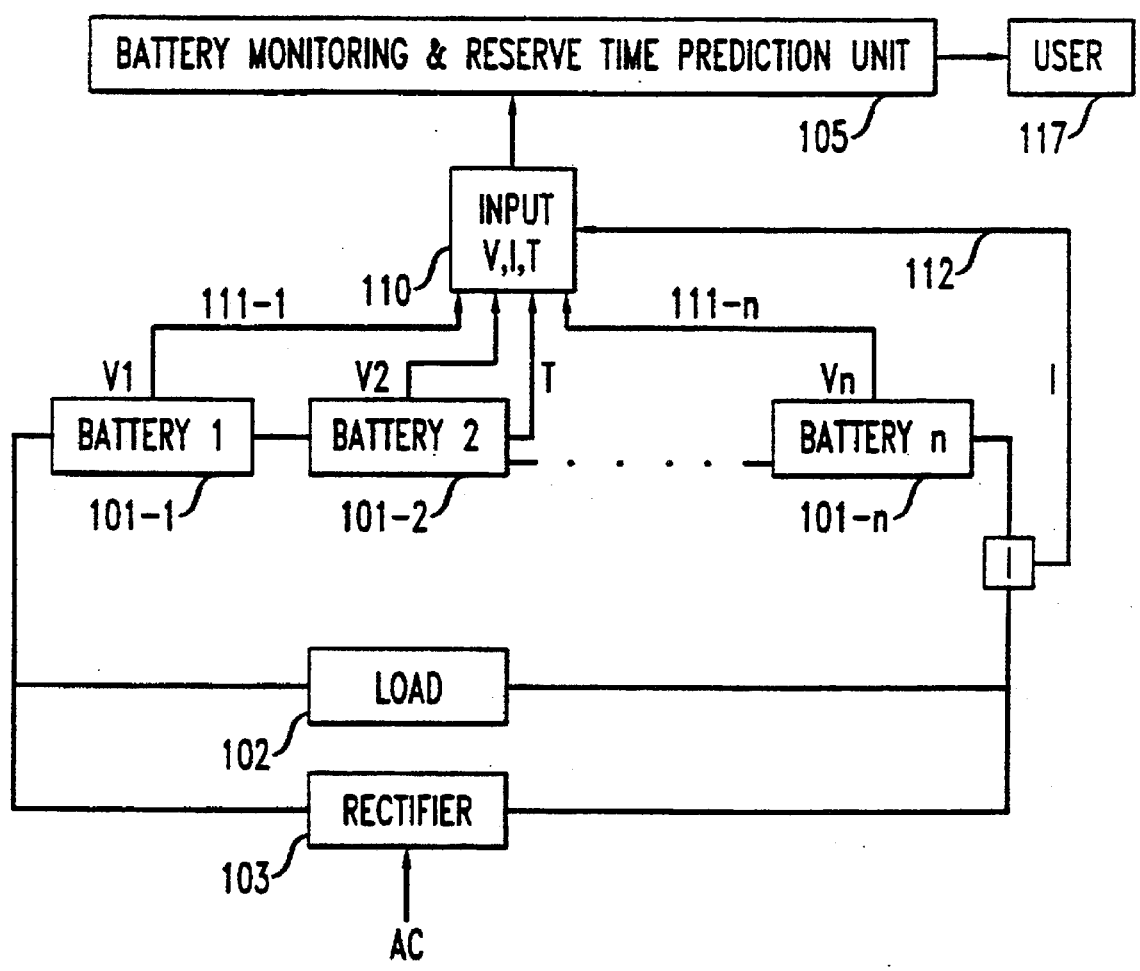
FIG. 1 is a block schematic of a battery plant and its monitoring system.

The battery plant and monitoring system shown in the FIG. 1 includes a plurality of battery cells 101-1 to 101-n all of which are connected in series connection to power a load 102. A rectifier 103 is connected to receive AC line power and provide a rectified charging voltage to recharge the string of battery cells 101-1 to 101-n. A battery monitoring unit 105 having stored program control is connected to a controller-battery interface 110. The battery interface 110 has connections 111-1 to 111-n to sense the voltage of each battery cell and a connection 112 to sense the load current and a connection 113 to sense a temperature of at least one battery cell. The battery monitoring unit has an access device 117 for user input and data output.

The battery monitoring unit 105 includes a stored program control which accepts data from the battery interface and background data from the user input/access device 117. The stored program controller also includes instructions for utilizing the data input for predicting a remaining charge capacity and reserve time until discharge to a specified end voltage of the batteries 101 in the string of batteries. This determination is communicated through the user access interface 117 to a data output which may include communication with a distant output device.

Figure 2:
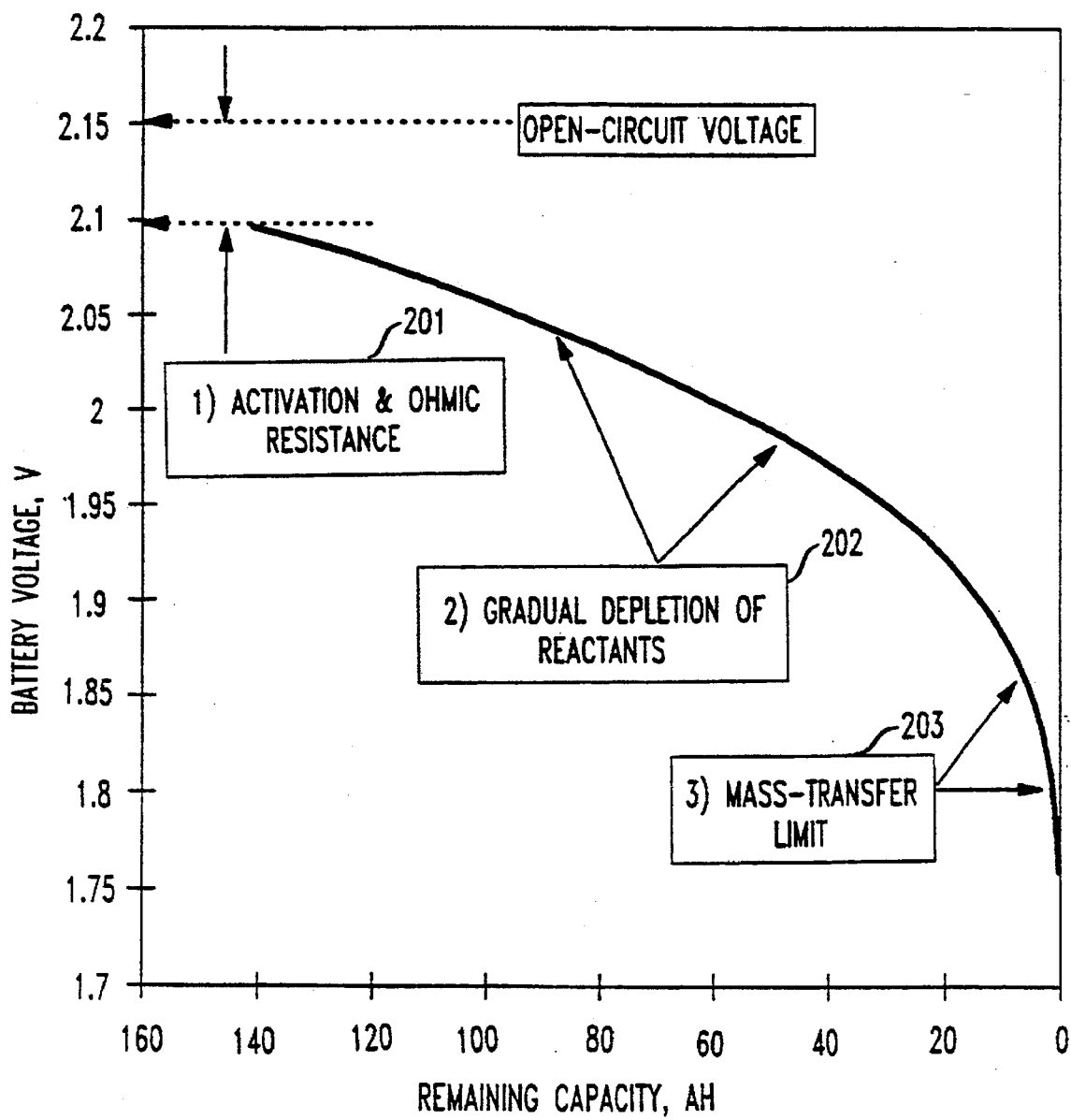
FIG. 2 is a graph of a typical battery discharge curve in terms of battery voltage versus ampere-hours removed.

The conventional graph of battery discharge capacity is shown by the graph illustrated in the FIG. 2. This discharge curve is plotted in terms of voltage versus ampere-hours. This curve exhibits three distinct characteristic regions. The initial region 201 shows an initial drop in battery voltage due to the phenomenon of activation and ohmic resistance. The second subsequent region 202, shows a gradual decrease in battery voltage due to a continuous increase in the internal resistance of the battery during discharge. This resistive increase is due to depletion of reactants and/or active surface areas in the battery. The final region 203 shows a sharp decrease in the battery voltage due to the discharge reactions becoming starved of reactants, whose transport to the electrode surfaces has become mass-transfer limited. These complex changes during discharge are believed to be related to the remaining capacity of the battery during discharge.

The discharge characteristic of a battery is based on a ratio of remaining capacity/maximum theoretical capacity Q/Qmax versus the temperature corrected battery overvoltage. While the actual capacity Q may be used in place of Qmax, the ratio is invariant to battery size. The remaining capacity to an end voltage, at a given battery voltage, is calculated from the difference between the remaining capacity Q at that battery voltage and the remaining capacity at that end voltage.

Figure 3:
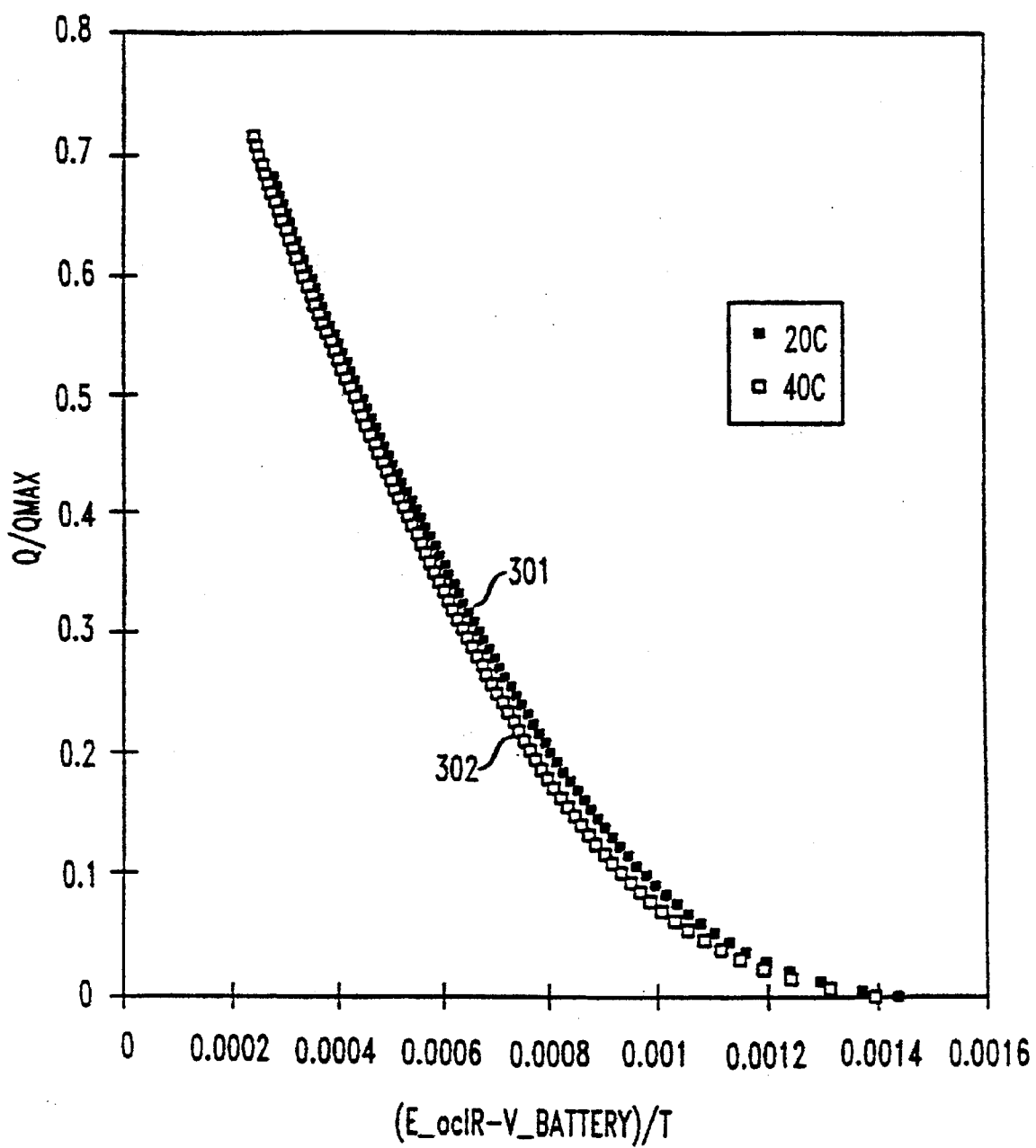
FIG. 3 is a graph of a typical battery discharge curve in terms of charge ratio versus temperature-corrected battery overvoltage.

The effect of temperature on discharge is shown in the graph of FIG. 3, which illustrates the discharge curves 301 and 302 of the same battery at two different temperatures.

Figure 4:
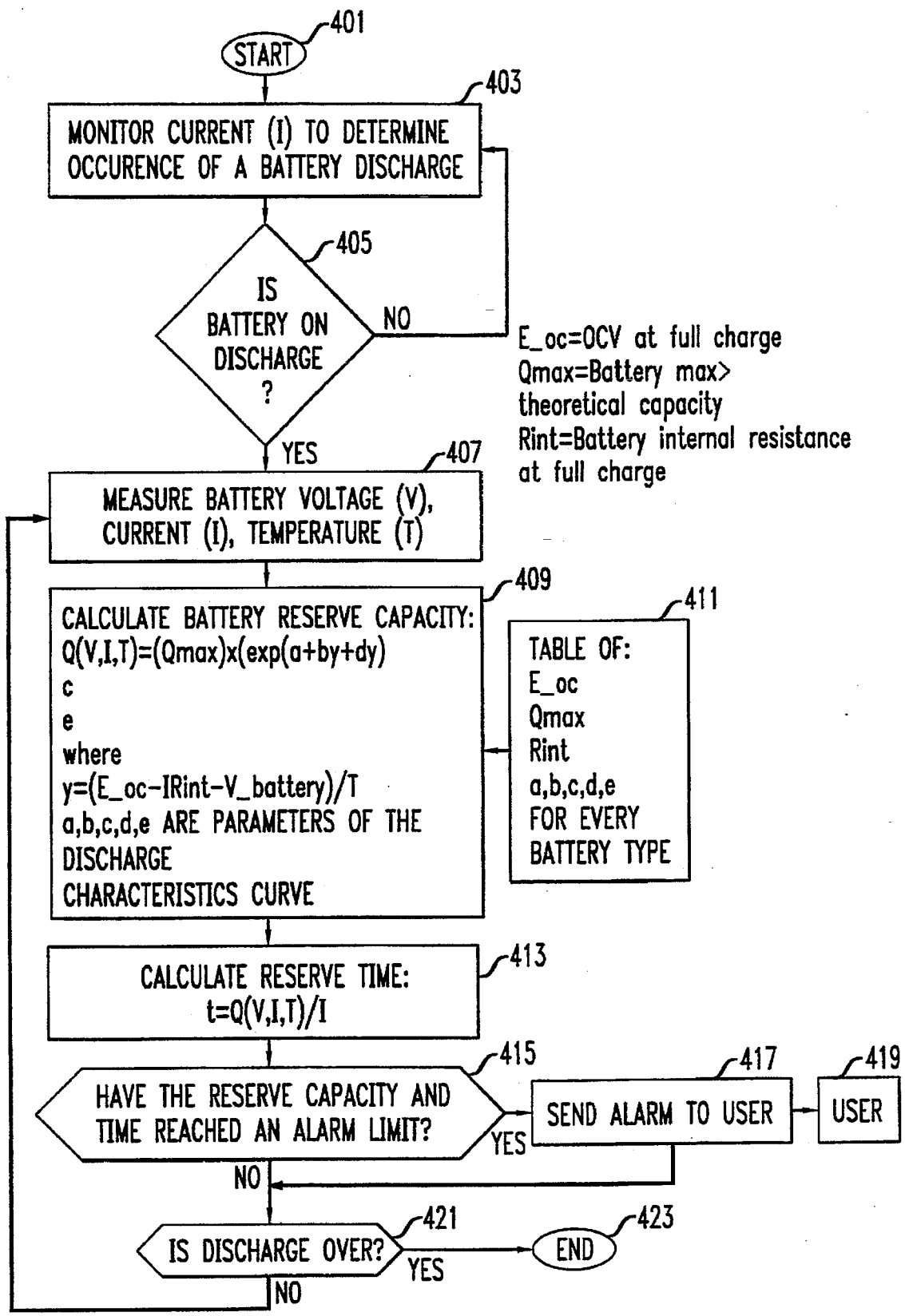
FIG. 4 is a flow graph illustrating the method of determining the remaining capacity Q and reserve time t of a discharging battery.
Figure 1:
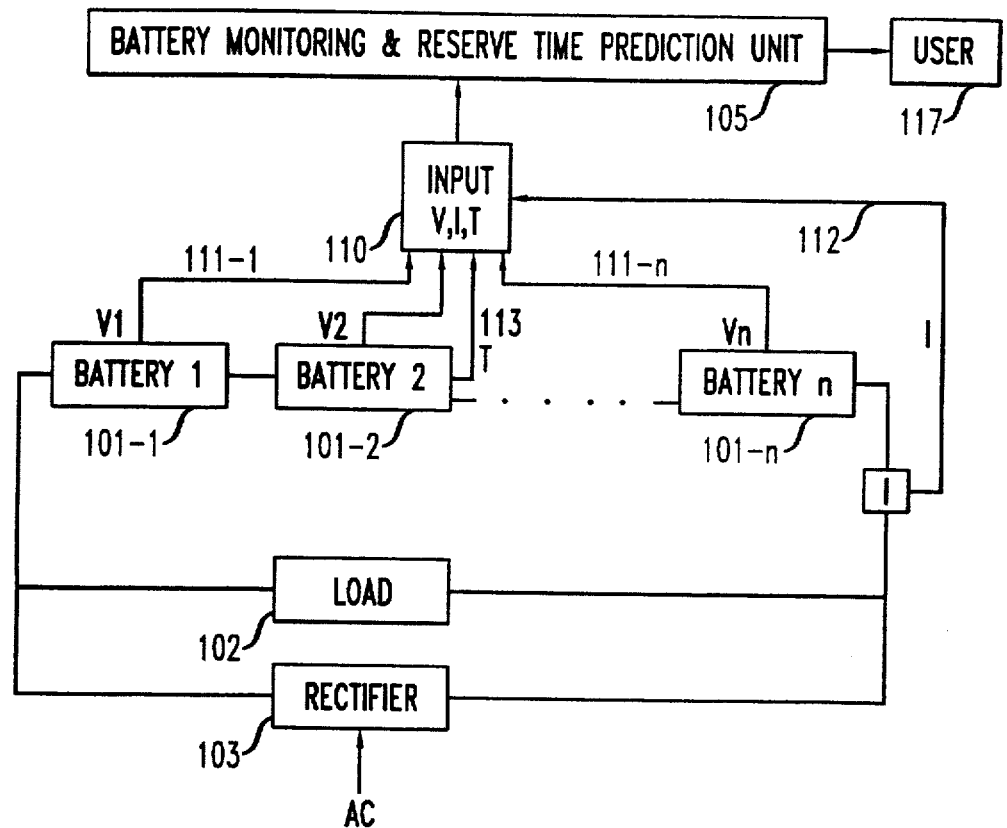

The method of predicting the remaining capacity and reserve time t of a discharging battery according to the stored instructions of the controller is shown in the flow diagram of FIG. 4. The process starts at terminal 401 and proceeds to the block 403 whose instructions have the controller retrieve the discharge current sensed by the interface monitor. The instructions operate as per decision block 405, to determine if the battery is in discharge by observing the direction of current flow. If the battery is not discharging the controller continues to monitor current flow as per block 403. If the battery is in discharge, battery voltage, current and temperature are measured and recorded per the instructions of block 407. The instructions of block 409 use these monitored parameters to calculate a battery reserve capacity. The process uses a table of battery characteristics and parameters provided from memory as per block 411. The calculation process determines the remaining battery capacity per:

$$Q(V,I,T) = (Q_{max}) \times \exp(a + b\eta^c + d\eta^e) \quad (8)$$

where the term $\eta$ is:

$$\eta = \frac{(E_{oc} - IR_{int} - V_{battery})}{T} \quad (9)$$

and a,b,c,d and e are curve fitting parameters of the discharge characteristic curve. The next step defined by the instruction of block 413 calculates the actual predicted reserve time t by the relation of:

$$t = Q(V,I,T)/I \quad (10)$$

The subsequent instructions of decision block 415 determine if the calculated reserve capacity and time have reached an alarm limit. If an alarm limit is reached, the alarm is sent to the user as indicated in the block 417 and block 419. If no limit has been reached, the decision block 421 determines whether the discharge condition is over. If discharge has terminated, the process is terminated as per block 423. If the discharge is continuing, the flow returns to the Block 407 and the process is continued.

I claim:

1. A method of predicting a remaining reserve capacity (Q) and a reserve time of a battery in a process of discharge, comprising the steps of:

determining an open circuit voltage ($E_{oc}$) of the battery;
   measuring a discharge current (I) and discharge voltage ($V_{battery}$) of the battery;
   measuring a temperature (T) of the battery;
   determining the remaining reserve capacity of the battery by deriving a value for a temperature-corrected battery overvoltage ($\eta$), defined as:

$$= \frac{E_{oc} - IR_{int} - V_{battery}}{T},$$

where $R_{int}$ is the battery internal resistance; and
   using the remaining reserve capacity to determine the reserve time.

2. A method of predicting a remaining reserve capacity and a reserve time of a battery in a process of discharge as recited in claim 1, wherein the step of determining the remaining reserve capacity of the battery further includes expressing a ratio of the remaining reserve capacity (Q) to a maximum theoretical capacity ($Q_{max}$) as an exponential function.

3. A method of predicting a remaining reserve capacity and a reserve time of a battery in a process of discharge as recited in claim 2, wherein the exponential function is:

$$\frac{Q}{Q_{max}} = \exp^{(a + b\eta^c + d\eta^e)}$$

where $Q_{max}$, a,b,c,d, and e are predetermined parameters determined by a discharge characteristic curve of the battery.

4. A method of predicting a remaining reserve capacity and a reserve time of a battery in a process of discharge as recited in claim 1 wherein the step of using the remaining reserve capacity to determine the reserve time comprises calculating a ratio of the remaining reserve capacity (Q) to the discharge current (I).

5. A method of predicting a reserve time of a discharging battery with a known maximum capacity ($Q_{max}$), comprising the steps of:

determining a temperature-corrected battery overvoltage (η), defined as:

$$\eta = \frac{E_{oc} - IR_{int} - V_{battery}}{T},$$

where $R_{int}$ is the battery internal resistance $E_{oc}$ is the battery overvoltage and $V_{battery}$ is the battery discharge voltage;
   exponentially-relating the temperature-corrected battery overvoltage to a ratio of a remaining reserve capacity (Q) of the discharging battery to the maximum capacity ($Q_{max}$); and
   measuring a discharge current (I) and dividing the remaining reserve capacity of the discharging battery by the discharge current to determine the reserve time to discharge the battery to an end voltage.

6. A method of predicting a reserve time of a discharging battery with a known maximum capacity as recited in claim 5, wherein the step of exponentially-relating the temperature-corrected battery overvoltage to a ratio of the remaining reserve capacity (Q) of the discharging battery to its maximum capacity ($Q_{max}$) includes evaluation of the equation;

$$\frac{Q}{Q_{max}} = \exp^{(a+b\eta^c+d\eta^e)},$$

where a,b,c,d and e are predetermined parameters determined by a discharge characteristic curve of the battery.

7. A method of predicting a remaining reserve capacity (Q) and a reserve time of a battery, comprising the steps of:
   measuring a discharge voltage of the battery, measuring a discharge current of the battery and measuring a temperature of the battery to determine a temperature-corrected battery overvoltage (η) defined as:

$$\eta = \frac{E_{oc} - IR_{int} - V_{battery}}{T}$$

where $E_{oc}$ is the battery open circuit voltage, I is the discharge current of the battery, $R_{int}$ is the internal resistance of the battery, $V_{battery}$ is the discharge voltage of the battery and T is the temperature of the battery;
   determining the remaining reserve capacity (Q) using a discharge characteristic curve for the battery, the curve defined by the equation:

$$\frac{Q}{Q_{max}} = \exp^{(a+b\eta^c+d\eta^e)},$$

where $Q_{max}$, a,b,c,d and e are predetermined parameters determined by a discharge characteristic curve of the battery; and
   determining the reserve time according to the relation:

$$\text{Reserve Time} = \frac{Q}{I}.$$

8. A method of predicting a remaining reserve capacity (Q) and a reserve time (t) of a discharging battery, comprising the steps of:

measuring discharge data of the battery at selected constant discharge currents to derive a characteristic discharge curve for the battery, the curve defined by the equation:

$$\frac{Q}{Q_{max}} = \exp^{(a+b\eta^c+d\eta^e)},$$

where η is defined as a temperature-corrected battery overvoltage having a value of:

$$\eta = \frac{E_{oc} - IR_{int} - V_{battery}}{T}$$

and where $Q_{max}$ is a maximum theoretical capacity of the battery, $E_{oc}$ is a battery open circuit voltage, I is a discharge current of the battery, $R_{int}$ is an internal resistance of the battery, $V_{battery}$ is a battery voltage during discharge, T is a battery temperature, and a,b,c,d, and e are curve fitting parameters; and solving for the reserve time according to the relation $$t = \frac{Q}{I}.$$

9. Apparatus for predicting a remaining reserve capacity (Q) and a reserve time (t) of a battery, comprising:
   voltage sensing circuitry connected to a terminal voltage of the battery;
   current sensing circuitry connected for sensing a discharge current (I) of the battery;
   a temperature sensing device positioned for sensing a temperature (T) of the battery;
   a battery monitoring circuit connected to receive input from the voltage sensing circuitry, the current sensing circuitry and the temperature sensing device, and including a reserve time prediction sub-unit having:
   a stored program controller for controlling and receiving input from the voltage sensing circuitry, the current sensing circuitry and the temperature sensing device and determining if the battery is discharging;
   memory associated with the stored program controller and including data indicative of a battery open circuit voltage ($E_{oc}$), a battery internal resistance ($R_{int}$), and a maximum theoretical capacity ($Q_{max}$);
   the stored program controller including instructions for determining a value of:

$$\frac{Q}{Q_{max}} = \exp^{(a+b\eta^c+d\eta^e)},$$

where η is a temperature-corrected battery overvoltage parameter of the battery, and a,b,c,d, and e are curve fitting parameters, and calculating the reserve time using the equation:

$$t = \frac{Q}{I}.$$

10. A method of predicting a remaining reserve capacity (Q) and a reserve time (t) of a battery, comprising the steps of:
    determining an open circuit voltage ($E_{oc}$) of the battery;
    measuring a discharge current (I) and discharge voltage ($V_{battery}$) of the battery;
    measuring a temperature (T) of the battery;

determining the remaining reserve capacity of the battery by deriving a value for a temperature-corrected battery overvoltage ($\eta$), defined as:

$$\eta T = E_{oc} - IR_{int} - V_{battery}$$

where $R_{int}$ is the battery internal resistance; and using the remaining reserve capacity to determine the reserve time.

11. A method of predicting a remaining reserve capacity and a reserve time of a battery as recited in claim 10, wherein the step of determining the remaining reserve capacity of the battery includes expressing a ratio of remaining reserve capacity to a maximum theoretical capacity ($Q_{max}$) of the battery as a function of the temperature-corrected battery overvoltage ($\eta$), the function being:

$$\frac{Q}{Q_{max}} = f(\eta).$$

12. A method of predicting a remaining reserve capacity (Q) and a reserve time of a battery as recited in claim 11 wherein the function is:

$$\frac{Q}{Q_{max}} = \exp^{(a+b\eta^c + d\eta^e)},$$

where a,b,c,d and e are curve fitting parameters that tailor the function to a characteristic discharge curve of the battery.

13. A method of predicting a remaining reserve capacity (Q) and reserve time (t) of a battery, comprising the steps of:

determining an open circuit voltage of the battery;

measuring a discharge current (I) and discharge voltage of the battery;

determining the remaining reserve capacity of the battery by deriving a value for a temperature-corrected battery overvoltage based on determined and measured battery parameters including the open circuit voltage, the discharge current, and the discharge voltage of the battery; and determining the reserve time by calculating a ratio of the remaining reserve capacity (Q) to the discharge current (I).

14. A method of predicting a remaining reserve capacity and a reserve time of a battery as recited in claim 13, further comprising the step of:

measuring a temperature of the battery.

15. A method of predicting a remaining reserve capacity and a reserve time of a battery as recited in claim 14, wherein the temperature of the battery is assumed to be an ambient temperature about the battery.

* * * * *

UNITED STATES PATENT AND TRADEMARK OFFICE
CERTIFICATE OF CORRECTION

PATENT NO. : 5,631,540  
DATED : May 20, 1997  
INVENTOR(S) : Trung V. Nguyen

Page 1 of 2

It is certified that error appears in the above-indentified patent and that said Letters Patent is hereby corrected as shown below:

Substitute attached FIG. 1 for FIG. 1 on Sheet 1 of 4.

Signed and Sealed this

Sixth Day of January, 1998

Attest:

BRUCE LEHMAN

Attesting Officer

Commissioner of Patents and Trademarks